United States Patent [19]

Reich

[11] Patent Number: 5,023,609

[45] Date of Patent: Jun. 11, 1991

[54] DIGITAL DEEMPHASIS CIRCUIT

[75] Inventor: Werner Reich, Emmendingen, Fed. Rep. of Germany

[73] Assignee: Deutsche ITT Industries GmbH, Freiburg, Fed. Rep. of Germany

[21] Appl. No.: 352,228

[22] Filed: May 15, 1989

[30] Foreign Application Priority Data

Jun. 7, 1988 [EP] European Pat. Off. ............ 88109041

[51] Int. Cl.$^5$ .............................................. H04N 5/60
[52] U.S. Cl. ....................................... 341/50; 358/198
[58] Field of Search ..................... 341/50; 364/724.01, 364/724.19, 724.20; 375/103; 358/198

[56] References Cited

U.S. PATENT DOCUMENTS

| 4,611,226 | 9/1986 | Buhse et al. | 358/198 |
| 4,646,150 | 2/1987 | Robbins et al. | 358/198 |
| 4,901,151 | 2/1990 | Mehrgardt et al. | 358/198 |

FOREIGN PATENT DOCUMENTS

| 2134357 | 8/1984 | United Kingdom . |
| 2196519 | 4/1988 | United Kingdom . |

OTHER PUBLICATIONS

Leslie B. Tyler, et al., "A Companding System for Multichannel TV Sound," IEEE Transactions on Consumer Electronics, Nov. 1984, pp. 633-640.

Z. Raz, et al., "A Digital Signal Processing Approach to Multichannel Television Sound Decoding", IEEE Transactions on Consumer Electronics, Aug. 1986, pp. 453-461.

J. James Gibson, "Effects on Receiver Design and Transmission Impairments on Audio Signal Quality in the BTSC System for Multichannel Television Sound", J. Audio Eng. Soc., vol. 34, No. 9, Sep. 1986.

G. W. McNally, "Dynamic Range Control of Digital Audio Signals*", Jounral of the Audio Engineering Society, May 1984, pp. 316-327.

Primary Examiner—William M. Shoop, Jr.
Assistant Examiner—Marc S. Hoff
Attorney, Agent, or Firm—Thomas L. Peterson

[57] ABSTRACT

A digital deemphasis circuit for the BTSC multichannel television standard includes a square-root extractor, a digital filter having the transfer function $F(z)=(b-ac)/(z+a)$, where a, b and c are constants that determine the frequency response of the digital filter. The digital deemphasis circuit further includes a subcircuit that transforms the output signal from the square-root extractor into three quantities w1, w2, w3 that are applied as multiplicands to three multipliers to control the operation of the deemphasis circuit.

8 Claims, 3 Drawing Sheets

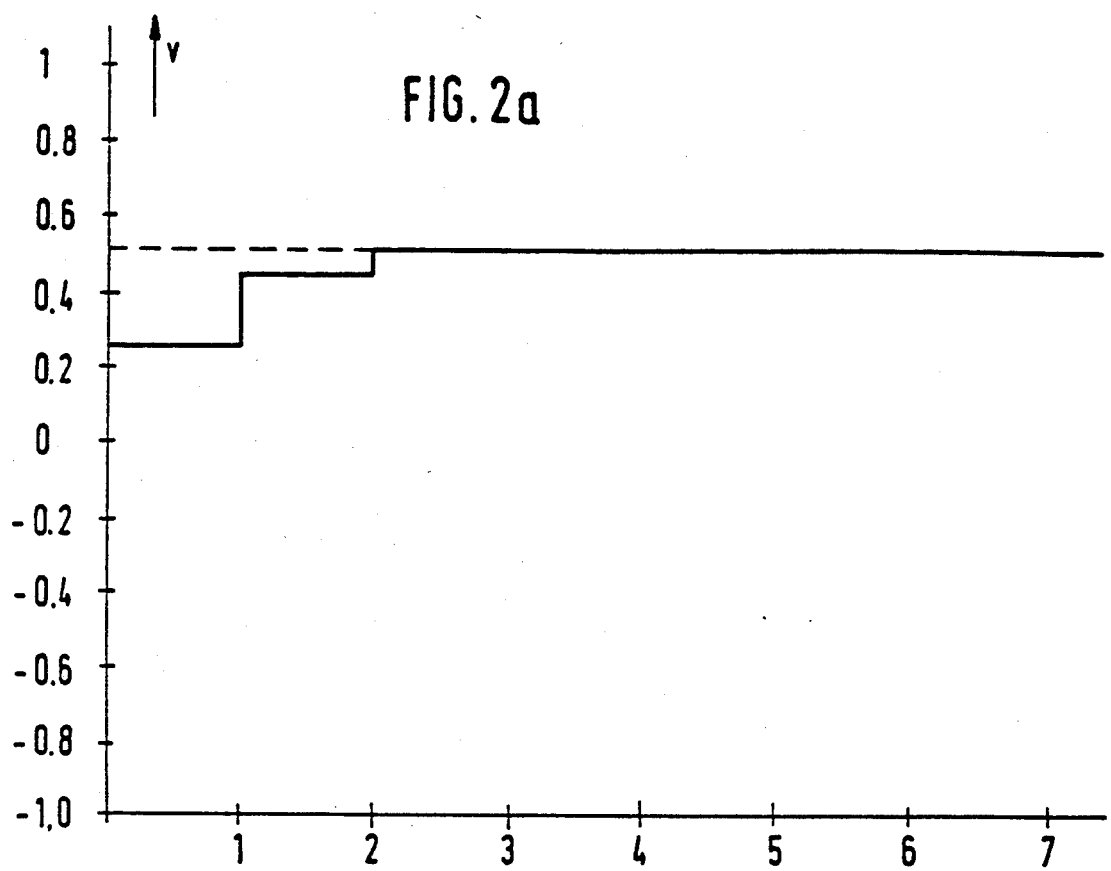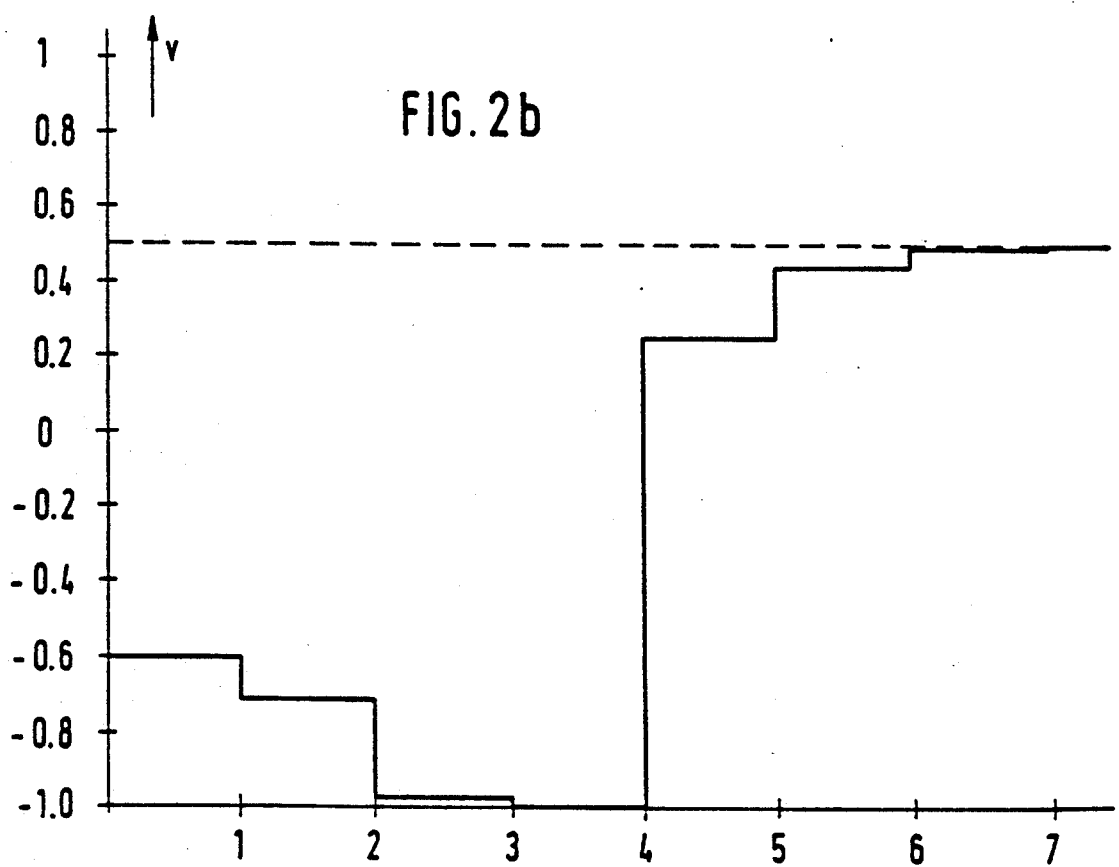

DIGITAL DEEMPHASIS CIRCUIT

BACKGROUND OF THE INVENTION

1. Field of the Invention

The present invention is in the field of digital deemphasis circuits for volume-compressed, amplitude-normalized audio signals which are digitized in the two's complement binary system, and, in particular, in the field of digital deemphasis circuits which can be implemented in the audio sections of television receivers designed to receive the Electronics Industries Association (EIA) Broadcast Television Systems Committee (BTSC) multichannel television standard

2. Description of the Related Art

The EIA BTSC is a relatively new standard for transmission of stereo information with the simultaneous opportunity for broadcasting a separate second audio program. The system of this standard is described in detail, for example, in Leslie B. Tyler, et al., "A COMPANDING SYSTEM FOR MULTICHANNEL TV SOUND," *IEEE Transactions on Consumer Electronics*, November 1984, pp. 633-640. In that article, the individual subcircuits in the described system are presented as analog-signal-processing circuits. Of particular interest in connection with the present invention are FIGS. 5 and 15 and the text of the description on pages 636-639.

It is desirable to use digital circuits in place of analog circuits in modern television receivers. The prior-art analog circuits described in the Tyler, et al., article, like many other analog circuits, cannot be readily converted to corresponding digital circuits for processing signals digitized by an analog-to-digital converter because, in the present case for example, such a direct replacement of analog circuits by corresponding digital circuits would lead to a feedback control loop without delay, which cannot be implemented digitally.

SUMMARY OF THE INVENTION

The present invention is a digital deemphasis circuit for use in processing digitized audio signals in a television receiver. The circuit is used in the television receiver to offset the preemphasis applied in accordance with the BTSC standard at the transmitting end. The deemphasis circuit according to the present invention can be readily implemented in the form of semiconductor integrated circuits and can be used to advantage in so-called digital television receivers.

BRIEF DESCRIPTION OF THE DRAWINGS

The invention will now be explained in greater detail with reference to the accompanying drawings, in which:

FIGS. 2a and 2b illustrate two curves used to explain the operation of a subcircuit of FIG. 1.

DETAILED DESCRIPTION OF THE PREFERRED EMBODIMENTS

Figure 1:
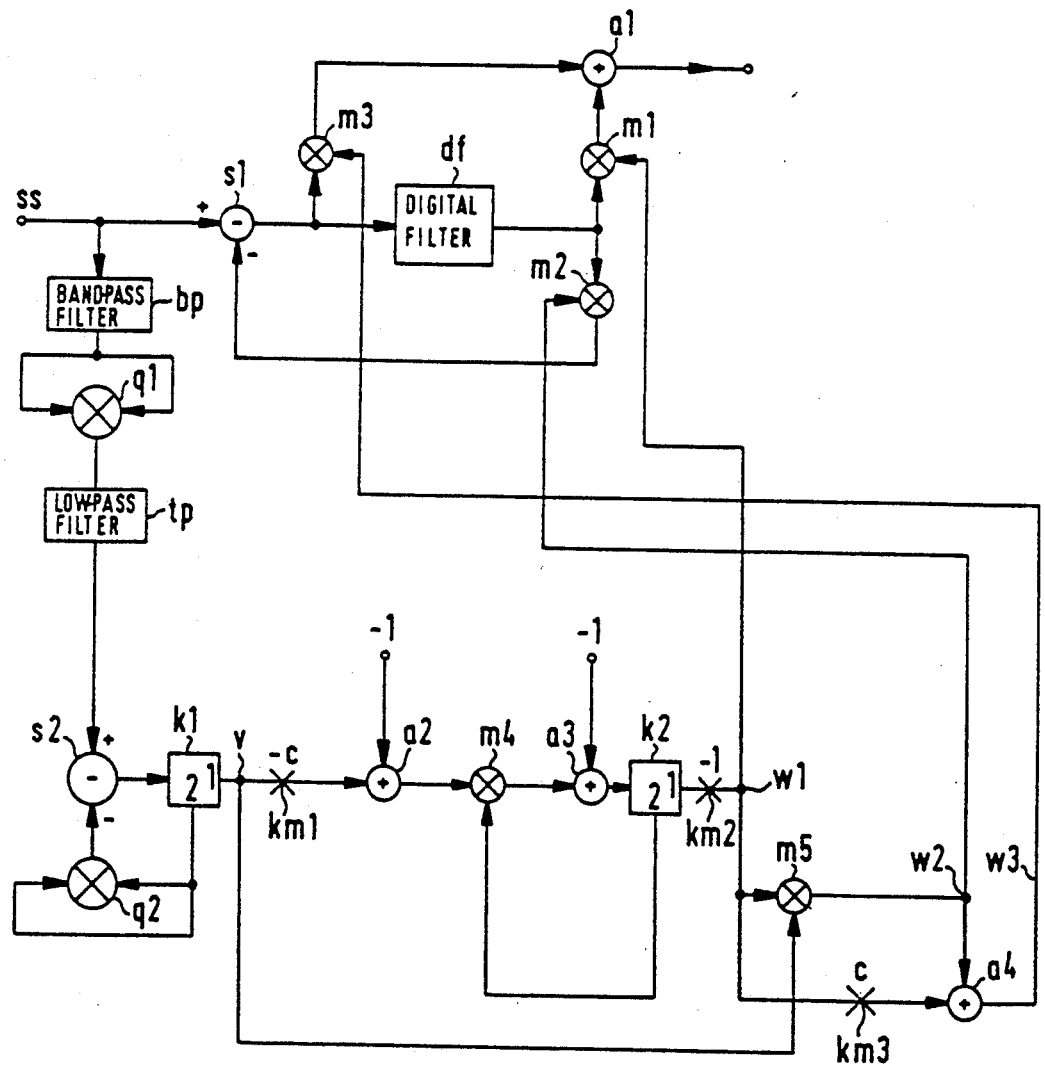
FIG. 1 illustrates a highly schematic block diagram of a first embodiment of the invention.
Figure 3:
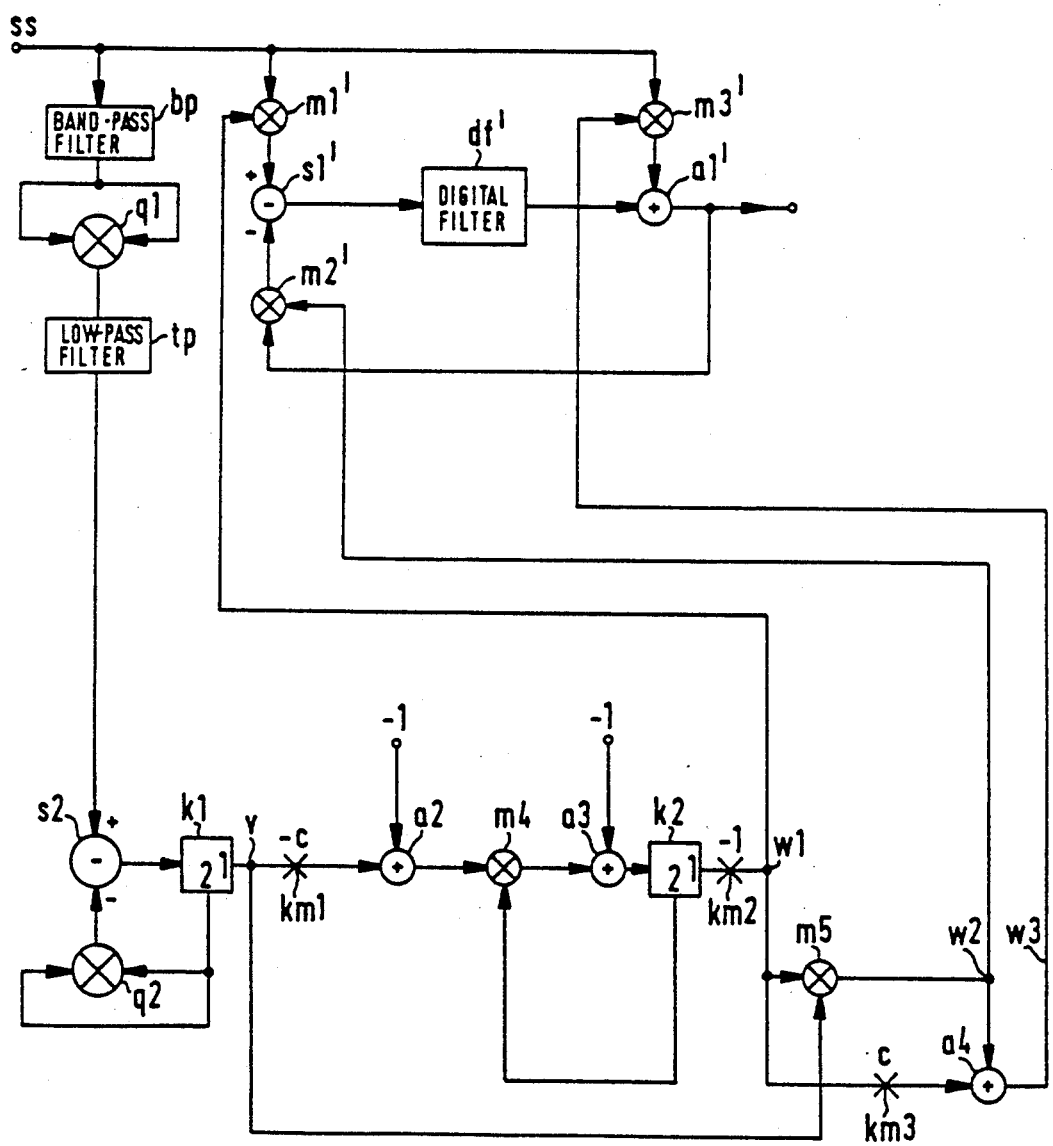
FIG. 3 illustrates a highly schematic block diagram of a second embodiment of the invention.

In FIGS. 1-3 of the drawings, it is assumed that a digital audio signal ss has been separated from a received television-transmitter signal and has been digitized by means of a conventional analog-to-digital converter to obtain signals in the two's complement binary system, and that the digital signals have been normalized in amplitude so that the amplitudes lie only in the digital number range between greater than or equal to $-1$ and less than $+1$ (i.e., $-1 \leq$ amplitude $< +1$). (The range limit "equal to $+1$" has been deliberately omitted, since in the two's complement binary system, as is well known, there is no positive 1 in left-justified representation, which is used in the present case.)

In FIG. 1, the audio signal ss is applied to the minuend input of a first subtracter s1, whose output controls the input of a digital filter df. The digital filter df has a transfer function:

$$F(z) = (b-ac)/(z+a),$$

where z, as is usual in the mathematical treatment of digital filters, is the complex frequency variable, and a, b and c are constants which determine the frequency response of the digital filter so that the deemphasis function conforming to the BTSC standard is obtained. Preferred decimal numerical values for the three constants are:

$$a = -118/128,$$

$$b = 2/128,$$

$$c = 8/128$$

The output of the digital filter df is connected to the first input of a first multiplier m1 and to the first input of a second multiplier m2. The output of the first multiplier m1 is coupled to the first input of a first adder a1, and the output of the second multiplier m2 is coupled to the subtrahend input of the first subtracter s1. The output of the first subtracter s1 is coupled to the first input of a third multiplier m3, whose output is connected to the second input of the first adder a1. The output of the first adder a1 provides the output signal of the deemphasis circuit.

The audio signal ss is also fed to the input of a band-pass filter bp. The band-pass filter bp is easy to implement as it is the counterpart of, and has virtually the same transfer function as, the corresponding analog band-pass filter of the above-mentioned Tyler, et al., reference. In particular, see FIGS. 9 and 10 and the description thereof in the left-hand column of page 637 of the Tyler, et al., reference. The output of the band-pass filter bp feeds a first squarer q1, which has an output that is applied through a low-pass filter tp to the minuend input of a second subtracter s2. The low-pass filter tp has a cutoff frequency which is of the order of 10 Hz.

The output of the second subtracter s2 is coupled to the input of a first accumulator k1, which is a limiting accumulator. The first accumulator k1 includes an internal adder (not shown) and an intermediate store (not shown) which operate in a conventional manner. The limiting first accumulator k1 is designed so that if either of the two above-mentioned limits of the number range is reached or if the results of additions by the adder exceed those limits, the internal adder of the first accumulator k1 will only deliver a signal representative of the respective limit. Expressing this in an example using decimal numbers, if the result of an addition is $-2$, the adder will limit its output to $-1$. Similarly, if the result is $+1.5$, the output will be limited to that next lower number than $+1$ which is possible with the number of bits of the audio signal The intermediate store in the first accumulator k1 is a register, or the like, via which the output of the adder in the first accumulator k1 is fed back to one input of the adder after being delayed by one period of the clock system controlling the digital signal processing. In the present invention, the first accumulator k1 has a first output 1 and a second output 2. The first output 1 of the first accumulator k1 is the output of the adder and is shown as a signal v. The second output 2 of the first accumulator k1 is the output of the intermediate store. The second output 2 is coupled to the inputs of a second squarer q2. The second squarer q2 has an output that is connected to the subtrahend input of the second subtracter s2.

The subcircuit comprising the second subtracter s2, the first accumulator and the second squarer q2, represents a surprisingly simple square-root extractor. In the second squarer q2, deliberate use is made of the fact that in the two's complement system, the square of the most negative number, $-1$, is not $+1$, but $-1$ again. (In left-justified two's complement numbers, the first zero is comparable to the zero before the point of a decimal fraction and is also the sign bit, while a one in this position gives the negative sign but is not comparable to the one before the point of a decimal fraction.)

The square-root extractor subcircuit (i.e., s2, k1, q2) compares the squared output value from the first accumulator k1 with the value of the audio signal ss fed to the subtracter s2, so that after a few sampling steps, the value corresponding to the square root of the output signal from the low-pass filter tp will appear at the output of the accumulator k1. This operation of the square-root extractor subcircuit is shown for two different initial conditions in FIGS. 2a and 2b. For ease of illustration, the y-axes of the two figures are marked with decimal values between $+1$ and $-1$, and the x-axes are marked with a few sampling instants of the above-mentioned clock system. The sampling instants are numbered from 1 to 7.

FIG. 2a illustrates the case where the output of the low-pass filter tp has the value $0.25 = 2^{-2}$ over the seven sampling instants, and where the intermediate store of the first accumulator k1 has an initial value of 0 (zero). As shown in FIG. 2a, the signal v provided at the first output 1 of the first accumulator K1 (i.e., at the output of the adder of the first accumulator k1 converges with sufficient accuracy toward the square root of 0.25, namely 0.5 already at the third sampling instant (3).

In FIG. 2b, the value of the low-pass filter output, 0.25, is again assumed to be constant over the seven sampling instants, but the initial value assumed for the signal at the output of the intermediate store has an inch initial value of $-0.55$. FIG. 2b shows that in this case, also, the signal v converges toward the target value 0.5. It is interesting that first, at the first, second and third sampling instant numbers (1, 2 and 3) the square-root extractor subcircuit (s2, k1, q2) tends toward increasingly negative numbers, and that only after reaching $-1$ does it "jump" to the positive number range, from where it converges monotonically toward the target value 0.5.

The frequency of the clock system is much higher than the frequency required by the sampling theorem. Thus, a "transient time" of several sampling periods is readily permissible.

The signal v appearing at the first output of the first accumulator k1, which, as mentioned above, represents the root-mean-square value, is applied to the input of a first constant multiplier km1, which multiplies by the constant $-c$. The output of the first constant multiplier km1 is coupled to the first input of a second adder a2. The output of the second adder a2 is connected to the first input of a fourth multiplier m4. The output of the fourth multiplier m4 is coupled to the first input of a third adder a3. The second inputs of the second and third adders a2, a3 are fed with a signal for the constant number $-1$.

The output of the third adder a3 is connected to the input of a second accumulator k2, which is preferably a limiting accumulator similar to the first accumulator k1, and which has a first output 1 and a second output 2. The first output 1 of the second accumulator k2 is coupled to the input of a second constant multiplier km2, which multiplies the input by $-1$. The output of the second constant multiplier km2 is a signal w1 which is applied to the second input of the first multiplier m1, to the first input of a fifth multiplier m5, and to the input of a third constant multiplier km3. The third constant multiplier km3 multiplies the value at its input by the constant c. The first input of a fourth adder a4 is connected to the output of the fifth multiplier m5, and the second input of the fourth adder a4 is connected to the output of the third constant multiplier km3. The output of the fourth adder a4 is a signal w3 which is coupled to the second input of the third multiplier m3. The output of the fifth multiplier m5 is a signal w2 which is coupled to the second input of the second multiplier m2.

In the second embodiment of the invention, illustrated in FIG. 3, the lower portion of the figure is identical with the lower portion of FIG. 1 and the elements are identified the same. Only the upper portion of FIG. 3, having elements identified with reference characters provided with a prime, differs from the corresponding portion of FIG. 1. The difference between the two embodiments comprises the different arrangement and interconnection of the first, second and third multipliers m1', m2', m3', the first subtracter s1', the first adder a1', and the digital filter df', while the control (i.e., the inputs to the first, second and third multipliers m1', m2', m3') from the lower portion of FIG. 3 is the same as in FIG. 1.

In FIG. 3, the audio signal ss is applied to the first input of the first multiplier m1' and to the first input of the third multiplier m3'. The output of the first multiplier m1', is coupled to the minuend input of the first subtracter s1', whose output is connected to the input of the digital filter df'. The digital filter df' has the same transfer function as the digital filter df of FIG. 1. The output of the digital filter df' is connected to one input of the first adder a1'. The second input of the first adder a1' is connected to the output of the third multiplier m3'. The output of the first adder a1' is again the output of the deemphasis circuit.

The subtrahend input of the subtracter s1' is connected to the output of the second multiplier m2'. The first input of the second multiplier m2' is connected to the output of the first adder a1'. The second input of the second multiplier m2' is connected to the output of the fifth multiplier m5 and receives the signal w2 therefrom. The second input of the first multiplier m1' is connected to the output of the second constant multiplier km2 and receives the signal w1 therefrom. The second input of the third multiplier m3' is connected to the output of the fourth adder a4 and receives the signal w3 therefrom.

In both embodiments of the invention, the above-mentioned conversion of the analog circuit to the desired digital circuit is accomplished essentially by transforming the signal v, which corresponds to the analog root-mean-square control signal, by means of the subcircuit following the first accumulator k1 into three signals w1, w2, w3, which are fed to the three multipliers m1, m1'; m2 m2'; m3, m3'. To a very good approximation w1=1/(1+cv);

w2=v/(1+cv)=vw1;

w3=(c+v)/(1+cv)=cw1+w2.

To form the signal w1, use is made of a feedback control loop comprising the fourth multiplier m4, the third adder a3, and the second accumulator k2. The control loop is comparable to the above-described square-root extractor (i.e., the second subtracter s2, the first accumulator k1 and the second squarer q2), and by which the signal w1 is increased if too small, and increased if too large. The signals w1, w2, w3 are thus dependent only on the constant c and the signal v.

What is claimed is:

1. A digital deemphasis circuit for a volume-compressed, amplitude-normalized audio signal digitized in the two's complement binary system, said digital deemphasis circuit having an input terminal to receive a digitized audio input signal and an output terminal that provides a deemphasized audio output signal, said digital deemphasis circuit comprising:

a first subtracter having a minuend input, a subtrahend input and an output, said minuend input receiving said digitized audio signal;

a digital filter having an input and an output, said digital filter having a transfer function F(z)=(b−ac)/(z+a), where z is the complex frequency variable, and a, b, c are constants that determine the frequency response of said digital filter, said input of said digital filter connected to the output of said first subtracter;

a first multiplier having a first input, a second input and an output, said first input connected to said output of said digital filter;

a second multiplier having a first input, a second input and an output, said first input connected to said output of said digital filter;

a third multiplier having a first input, a second input and an output, said first input connected to said output of said first subtracter;

a first adder having a first input, a second input and an output, said first input connected to said output of said first multiplier and said second input connected to said output of said third multiplier, said output of said first adder connected to said output terminal to provide said deemphasized audio output signal;

a band-pass filter having an input and an output, said input of said band-pass filter connected to said input terminal to receive said digitized audio signal, a first squarer having an input and an output, said input of said first squarer connected to said output of said band-pass filter;

a low-pass filter having an input and an output, said input of said low-pass filter connected to said output of said first squarer, said low-pass filter having a cutoff frequency on the order of 10 Hz;

a second subtracter having a minuend input, a subtrahend input and an output, said minuend input connected to said output of said low-pass filter;

a first accumulator having an input and first and second outputs, said input of said first accumulator connected to said output of said second subtracter, said first output of said first accumulator providing a first accumulator output signal;

a second squarer having an input and an output, said input of said second squarer connected to said second output of said first accumulator, said output of said second squarer coupled to said subtrahend input of said second subtracter;

a first constant multiplier having an input and an output, said input of said first constant multiplier connected to said first output of said first accumulator to receive said first accumulator output signal, said first constant multiplier multiplying said first accumulator output signal by a constant −c;

a second adder having a first input, a second input and an output, said first input of said second adder connected to said output of said first constant multiplier, said second input of said second adder connected to receive a constant digital signal having a value of −1;

a fourth multiplier having a first input, a second input and an output, said first input of said fourth multiplier connected to said output of said second adder;

a third adder having a first input, a second input and an output, said first input of said third adder connected to said output of said fourth multiplier, said second input of said third adder connected to receive a constant digital signal having a value of −1;

a second accumulator having an input, a first output and a second output, said input of said second accumulator connected to said output of said third adder, said second output of said second accumulator connected to said second input of said fourth multiplier, said second accumulator providing a second accumulator output signal on said first output;

a second constant multiplier having an input and an output, said input connected to said first output of said second accumulator to receive said output signal from said second accumulator, said second constant multiplier multiplying said output signal from said second accumulator by a constant −1, said output of said second constant multiplier connected to said second input of said first multiplier;

a fifth multiplier having a first input, a second input and an output, said first input connected to said first output of said first accumulator, said second input connected to said output of said second constant multiplier, said output of said fifth multiplier connected to said second input of said second multiplier;

a third constant multiplier having an input and an output, said input connected to said output of said second constant multiplier, said third constant multiplier multiplying said output signal from said second constant multiplier by a constant c; and a fourth adder having a first input, a second input and an output, said first input connected to said output of said fifth multiplier, said second input connected to said output of said third constant multiplier, said output of said fourth adder connected to said second input of said third multiplier.

2. The digital deemphasis circuit as defined in claim 1, wherein said first accumulator is a limiting accumulator, said first accumulator having a first range limit and a second range limit such that when said first accumulator accumulates a value outside one of said first and second range limits, said accumulator generates an output value within said first and second range limits.

3. A digital deemphasis circuit for a volume-compressed, amplitude-normalized audio signal digitized in the two's complement binary system, said digital deemphasis circuit having an input terminal to receive an audio input signal and an output terminal that provides a deemphasized audio output signal, said digital deemphasis circuit comprising:

a first multiplier having a first input, a second input and an output, said first input connected to said input terminal to receive said audio input signal;

a first subtracter having a minuend input, a subtrahend input and an output, said minuend input connected to said output of said first multiplier;

a digital filter having an input and an output, said digital filter having the transfer function $$F(z) = (b - ac)/(z + a),$$

where z is the complex frequency variable, and a, b, c are constants that determine the frequency response of said digital filter, said input of said digital filter connected to said output of said first subtracter;

a first adder having a first input, a second input and an output, said first input connected to said output of said digital filter, said output of said first adder connected to said output terminal and providing said deemphasized audio output signal;

a second multiplier having a first input, a second input and an output, said first input connected to said output of said first adder;

a third multiplier having a first input, a second input and an output, said first input connected to said input terminal to receive said audio input signal, said output of said third multiplier connected to said second input of said first adder;

a band-pass filter having an input and an output, said input of said band-pass filter connected to said input terminal to receive said audio input signal;

a first squarer having an input and an output, said input of said first squarer connected to said output of said band-pass filter;

a low-pass filter having an input and an output, said input of said low-pass filter connected to said output of said first squarer, said low-pass filter having a cutoff frequency on the order of 10 Hz;

a second subtracter having a minuend input, a subtrahend input and an output, said minuend input connected to said output of said low-pass filter;

a first accumulator having an input, a first output and a second output, said input of said first accumulator connected to said output of said second subtracter, said first output of said first accumulator providing a first accumulator output signal;

a second squarer having an input and an output, said input of said second squarer connected to said second output of said first accumulator, said output of said second squarer connected to said subtrahend input of said second subtracter;

a first constant multiplier having an input and an output, said input connected to said output of said first accumulator to receive said first accumulator output signal, said first constant multiplier multiplying said first accumulator output signal by a constant $-c$;

a second adder having a first input, a second input and an output, said first input of said second adder connected to said output of said first constant multiplier, said second input of said second adder connected to receive a constant digital signal having a value of $-1$;

a fourth multiplier having a first input, a second input and an output, said first input of said fourth multiplier connected to said output of said second adder;

a third adder having a first input, a second input and an output, said first input of said third adder connected to said output of said fourth multiplier, said second input of said third adder connected to receive a constant digital signal having a value of $-1$;

a second accumulator having an input, a first output and a second output, said input of said second accumulator connected to said output of said third adder, said second output of said second accumulator connected to said second input of said fourth multiplier, said second accumulator providing a second accumulator output signal on said first output;

a second constant multiplier having an input and an output, said input connected to said first output of said second accumulator to receive said output signal from said second accumulator, said second constant multiplier multiplying said output signal from said second accumulator by a constant $-1$ and providing an output signal responsive thereto;

a fifth multiplier having a first input, a second input and an output, said first input connected to said first output of said first accumulator and said second input connected to said output of said second constant multiplier, said output of said fifth multiplier connected to said second input of said second multiplier;

a third constant multiplier having an input and an output, said input connected to said output of said second constant multiplier, said third constant multiplier multiplying said output signal from said second constant multiplier by a constant c; and a fourth adder having a first input, a second input and an output, said first input connected to said output of said fifth multiplier, said second input connected to said output of said third constant multiplier, said output of said fourth adder connected to said second input of said third multiplier.

4. The digital deemphasis circuit as defined in claim 3, wherein said first accumulator is a limiting accumulator, said first accumulator having a first range limit and a second range limit such that when said first accumulator accumulates a value outside one of said first and second range limits, said accumulator generates an output value within said first and second range limits 5. A digital deemphasis circuit for a volume-compressed, amplitude-normalized audio signal digitized in the two's complement binary system, said digital deemphasis circuit having an input terminal to receive a digitized audio input signal and an output terminal that provides a deemphasized audio output signal, said digital deemphasis circuit comprising:

a first subtracter having a minuend input, a subtrahend input and an output, said minuend input receiving said digitized audio signal;

a digital filter having an input and an output, said digital filter having a transfer function F(z)=(b−ac)/(z+a), where z is the complex frequency variable, and a, b, c are constants that determine the frequency response of said digital filter, said input of said digital filter connected to the output of said first subtracter;

a first multiplier having a first input, a second input and an output, said first input connected to said output of said digital filter;

a second multiplier having a first input, a second input and an output, said first input connected to said output of said digital filter;

a third multiplier having a first input, a second input and an output, said first input connected to said output of said first subtracter;

a first adder having a first input, a second input and an output, said first input connected to said output of said first multiplier and said second input connected to said output of said third multiplier, said output of said first adder connected to said output terminal to provide said deemphasized audio output signal;

a control circuit that generates control signals applied to said second inputs of said first, second and third multipliers, said control circuit comprising:

a band-pass filter that receives said audio input signal and generates a first filtered output signal;

a first squarer that receives said first filtered output signal and generates a squared output signal;

a low-pass filter that receives said squared output signal and generates a second filtered output signal;

a square-root extractor circuit that receives said second filtered output signal and generates a range-limited square root signal v;

a control loop that receives said range limited square-root signal and generates a first control signal w1 in accordance with:

w1=1/(−1+cv), said first control signal w1 applied to said first multiplier;

a multiplier having a first input that receives said first control signal w1, a second input that receives said square-root value v, and an output that generates a second control signal w2 in accordance with:

w2=vw1=v/(1+cv), said second control signal w2 connected to said second input of said second multiplier an adder having a first input that receives said second control signal w2 and having a second input that receives said first control signal w2 multiplied by said constant c, said adder having an output that generates a third control signal w3 in accordance with:

w3=cw1+w2=(c+v)/(1+cv), said third control signal w3 connected to said second input of said third multiplier.

6. The digital deemphasis circuit as defined in claim 5, wherein said square-root extractor circuit comprises:

a subtracter having a minuend input connected to receive said second filtered output from said low-pass filter, a subtrahend input and an output;

an accumulator having an input connected to said output of said subtracter, having a first output that provides said square-root value v, and having a second output; and a second squarer having an input connected to said second output of said accumulator and having an output connected to said second input of said subtracter.

7. A digital deemphasis circuit for a volume-compressed, amplitude-normalized audio signal digitized in the two's complement binary system, said digital deemphasis circuit having an input terminal to receive an audio input signal and an output terminal that provides a deemphasized audio output signal, said digital deemphasis circuit comprising:

a first multiplier having a first input, a second input and an output, said first input connected to said input terminal to receive said audio input signal;

a first subtracter having a minuend input, a subtrahend input and an output, said minuend input connected to said output of said first multiplier;

a digital filter having an input and an output, said digital filter having the transfer function F(z)=(b−ac)/(z+a), where z is the complex frequency variable, and a, b, c are constants that determine the frequency response of said digital filter, said input of said digital filter connected to said output of said first subtracter;

a first adder having a first input, a second input and an output, said first input connected to said output of said digital filter, said output of said first adder connected to said output terminal and providing said deemphasized audio output signal;

a second multiplier having a first input, a second input and an output, said first input connected to said output of said first adder;

a third multiplier having a first input, a second input and an output, said first input connected to said input terminal to receive said audio input signal, said output of said third multiplier connected to said second input of said first adder;

a control circuit that generates control signals applied to said second inputs of said first, second and third multipliers, said control circuit comprising:

a band-pass filter that receives said audio input signal and generates a first filtered output signal;

a first squarer that receives said first filtered output signal and generates a squared output signal;

a low-pass filter that receives said squared output signal and generates a second filtered output signal;

a square-root extractor circuit that receives said second filtered output signal and generates a range-limited square root signal v;

a control loop that receives said range limited square-root signal and generates a first control signal w1 in accordance with:

$$w1 = 1/(1+cv),$$

said first control signal w1 applied to said first multiplier;

a multiplier having a first input that receives said first control signal w1, a second input that receives said square-root value v, and an output that generates a second control signal w2 in accordance with:

$$w2 = vw1 = v/(1+cv),$$

said second control signal w2 connected to said second input of said second multiplier an adder having a first input that receives said second control signal w2 and having a second input that receives said first control signal w2 multiplied by said constant c, said adder having an output that generates a third control signal w3 in accordance with:

$$w3 = cw1 + w2 = (c+v)/(1+cv),$$

said third control signal w3 connected to said second input of said third multiplier.

8. The digital deemphasis circuit as defined in claim 7, wherein said square-root extractor circuit comprises:
a subtracter having a minuend input connected to receive said second filtered output from said low-pass filter, a subtrahend input and an output;
an accumulator having an input connected to said output of said subtracter, having a first output that provides said square-root value v, and having a second output; and
a second squarer having an input connected to said second output of said accumulator and having an output connected to said second input of said subtracter.

* * * * *